United States Patent
McFarland et al.

(10) Patent No.: US 6,436,318 B1
(45) Date of Patent: Aug. 20, 2002

(54) PAPER SUBSTRATES FOR USE IN INTEGRATED CIRCUIT PACKAGING MOLDING PROCESSES

(75) Inventors: Jonathan L. McFarland, Tempe; Steve W. Greathouse; Eric Gelvin, both of Chandler, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/538,654

(22) Filed: Mar. 30, 2000

(51) Int. Cl.⁷ .......................... B29C 33/68; B29C 33/72; B29C 45/02
(52) U.S. Cl. ...................... 264/39; 264/161; 264/272.17
(58) Field of Search ................................ 264/390, 161, 264/272.17, 271.1, 272.11, 276, 299, 328.4, 328.5, 313; 425/225

(56) References Cited

U.S. PATENT DOCUMENTS

| | | | | |
|---|---|---|---|---|
| 4,670,329 A | * | 6/1987 | Pas | 264/39 |
| 4,935,175 A | * | 6/1990 | Kitaura et al. | 106/38.6 |
| 5,053,172 A | * | 10/1991 | Yamasaki et al. | 264/39 |
| H1654 H | * | 6/1997 | Rounds | 264/272.11 |
| 5,735,040 A | * | 4/1998 | Ochi et al. | 156/291 |
| 5,893,380 A | * | 4/1999 | Lee | 134/21 |
| 5,961,912 A | * | 10/1999 | Huang et al. | 264/272.15 |
| 6,007,902 A | | 12/1999 | Adur et al. | 428/219 |
| 6,096,250 A | * | 8/2000 | Chen | 264/130 |

OTHER PUBLICATIONS

"International Paper", http://www.internationalpaper.com/our_brands/paper/office_consumer/springhill/springhill.shtml, 5, (Feb. 20, 2000).

\* cited by examiner

*Primary Examiner*—Angela Ortiz
(74) *Attorney, Agent, or Firm*—Schwegman, Lundberg, Woessner & Kluth, P.A.

(57) ABSTRACT

An apparatus and method for collecting compounds from a mold press is described herein. A paper substrate is loaded into a mold press in the same manner as a conventional substrate to collect compounds during set-up, cleaning and/or conditioning cycles. The used paper substrate with the cured compound is then discarded after use. Use of a paper substrate provides significant cost savings over the currently used metal-based substrate.

14 Claims, 8 Drawing Sheets

PAPER SUBSTRATES FOR USE IN INTEGRATED CIRCUIT PACKAGING MOLDING PROCESSES

FIELD

This invention relates generally to integrated circuit (IC) packaging molding processes, and in particular, the present invention relates to substrates for use in IC packaging molding processes.

BACKGROUND

The packaging molding process involves using a mold press for overmolding an integrated circuit (IC) mounted to a substrate. The overmolding provides an environmental seal. The molding compound itself is a polymeric epoxy material, i.e., a composite consisting of an epoxy resin, an epoxy hardener and a ceramic particle filler, such as silica. IC manufacturers typically receive the molding compound in the form of partially reacted pelletized powder preformed disks. The polymeric material is then processed in a transfer molding press that drives the compound through a heated mold. The heat of the mold causes the viscosity of the molding compound to decrease, allowing it to flow, such that it encapsulates the IC and fills the mold cavity. Once the epoxy resin and hardener completely react, the viscosity of the compound increases until it is hard enough to be ejected from the mold.

In order to set up a mold press for use, several preliminary runs are typically performed with the molding compound to properly establish the temperature, pressure and flow rate on a particular machine. These runs are made without the IC die in place. However, expensive metal-based substrates, such as substrates comprised of bismaleimide triazine (BT) and several metal layers, are routinely used to catch the molding compound after each run through the machine. The cured compound and BT substrates from these preliminary runs are then discarded. Use of expensive substrates in this manner is extremely wasteful and increases production costs substantially.

Additionally, a cleaning cycle is usually run every few hours to keep the mold press in good working order. During this cycle, a pelletized cleaning agent, such as melamine, is run through the mold in the same manner as described above for the molding compound. Again, cleaning runs are made without the IC die in place. However, the expensive metal-based substrates, such as BT substrates, are routinely used to catch the cured cleaning compound. The substrates now containing the cured cleaning compound are then discarded. Conditioning cycles are also run in a similar manner using a conditioning compound for conditioning the mold press. Again, use of metal-based substrates in this manner is very costly.

For the reasons stated above, and for other reasons stated below which will become apparent to those skilled in the art upon reading and understanding the present specification, there is a need in the art for a more practical and economical method of collecting used compounds from a mold press.

DETAILED DESCRIPTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that mechanical, procedural, electrical and other changes may be made without departing from the spirit and scope of the present inventions. The following detailed description is, therefore, not to be taken in a limiting sense, and the scope of the present invention is defined only by the appended claims, along with the full scope of equivalents to which such claims are entitled.

An apparatus and method for collecting compounds from a mold press is described herein. A paper substrate, without a die, is loaded into a mold press in the same manner as a conventional substrate, to collect compounds during set-up, cleaning and/or conditioning cycles. The used paper substrate with the cured compound is then discarded after use. Use of a paper substrate provides significant cost savings over a metal-based substrate.

Figure 1:
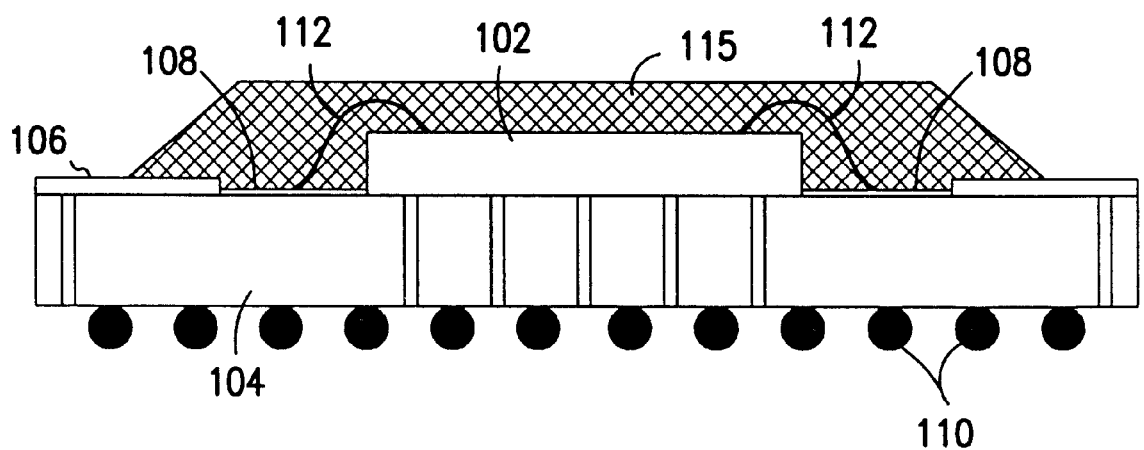
FIG. 1 is a prior art assembly of a die and substrate.

FIG. 1 shows a prior art assembly of a die 102 and conventional circuit substrate 104 that has been overmolded. The assembly further includes a solder mask 106, die pad 108, solder bumps 110 and wire bonds 112. The circuit substrate 104 may include various materials known in the art. In one embodiment, the circuit substrate 104 is a conventional BT substrate. The die 102 is subjected to an overmolding process to encapsulate the die 102 to the circuit substrate 104 with a molding compound 115 as shown. As noted above, set-up, cleaning and conditioning cycles are run in a similar manner using costly blank circuit substrates 104 without dies 102.

Alternatively, large pieces of thin paper approximately the size of entire large multi-strip molds are occasionally used to collect compound from set-up and cleaning cycles. However, because these papers are quite large, typically about one (1) meter by 1.2 meters, they are particularly difficult to handle, especially after cured compound has collected on them. Furthermore, if the paper is too thin, seepage can occur through to the mold press. Additional problems arise when different-sized mold presses are used, in that the paper must then be re-designed to align with different-sized stencils.

Figure 2A:
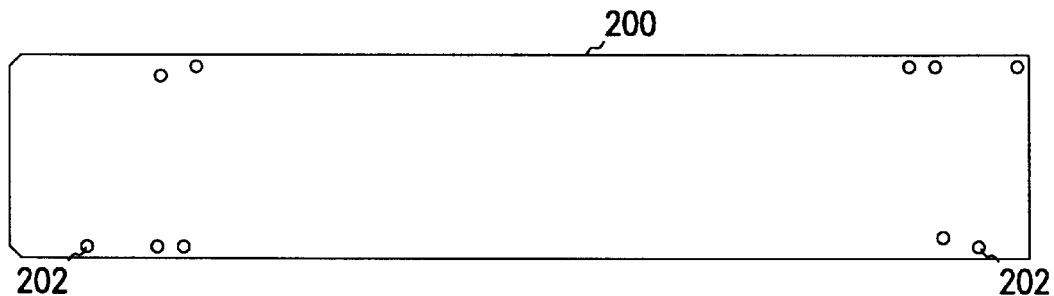
FIG. 2A is an illustration of a paper substrate with positioning holes in one embodiment of the present invention.

FIG. 2A shows a paper substrate 200 according to the present invention having a plurality of positioning or alignment holes 202 for proper alignment, although the invention is not so limited. The paper substrate 200 can be aligned in a mold press using any suitable type of alignment means known in the art for aligning substrates and masks. The paper substrate 200 can further be any suitable pre-defined size and shape, but is preferably a strip of material about the same size as conventional circuit substrates, such as BT substrates. In the embodiment shown in FIG. 2A, the paper substrate 200 is substantially rectangular shaped, although the invention is not so limited. In another embodiment, the paper substrate 200 is circular, square, oval, or any other regular or irregular shape suitable for a particular application. In a particular embodiment, the paper substrate 200 is about nineteen (19) centimeters (cm) in length and about four (4) cm in width.

In one embodiment, the positioning holes 202 are pre-punched prior to use. By pre-punching the positioning holes 202 in several locations, the paper substrate 200 can readily be used in a variety of mold press applications. In another embodiment, only one hole in each corner area is punched to align with a specific type of mold press. In yet another embodiment, holes are punched in less than each of the four (4) corners, such as in just two (2) corner areas. Each of the positioning holes 202 can be varying distances from the edge of the paper substrate 200 and from the corners, depending on the particular application. In one embodiment, positioning holes for varying strip sizes are all punched at the same time to cut down on the nonrefundable start-up costs required to make each punch. In one embodiment, the pre-punched positioning holes have diameters of about 1.5 mm (±0.04 mm). In another embodiment, there are no pre-punched positioning holes 202 and the paper substrates 200 are aligned by alternate means.

In the embodiment shown in FIG. 2A, two of the corners of the paper substrate 200 are cut in a diagonal manner, and the other two are slightly rounded, although the invention is not so limited. In another embodiment, all of the corners are cut diagonally. In yet another embodiment, the corners are all slightly rounded or substantially square. In yet another embodiment, some or all of the corners are substantially curved. Again, the size and shape of the paper substrate 200 is generally dependent on the type and size of mold press and on the size of the integrated circuit strip being overmolded.

Figure 2B:
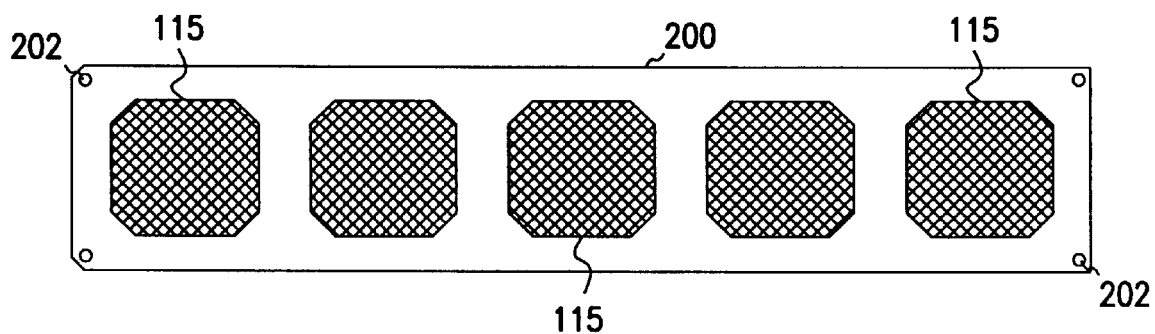
FIG. 2B is an illustration of a paper substrate with collected compound in one embodiment of the present invention.

FIG. 2B is an illustration of one type of appearance the paper substrate 200 can have after use in a mold press. In this embodiment, the residue collected on the paper substrate 200 is substantially square-shaped with diagonally-cut corners. The residue is cured compound 115 that flowed through five (5) different openings in a mask, such as masks used in transfer molding of plastic ball grid array (PBGA) chips. In other embodiments, each paper substrate 200 may contain more or less areas and shapes of cured compound 115 after use, depending on the particular application.

In one embodiment, the cured compound 115 is molding compound, such as a polymeric epoxy material. This occurs when the paper substrate is being used during set-up of the mold press for encapsulating packages, such as PBGA chips. Typically, several runs are made prior to actual production to adjust temperatures, pressures and flow rates. During these runs, it is necessary to collect the molding compound to prevent it from bleeding and seeping into unwanted areas of the mold press. By using the paper substrate 200, the molding compound is adequately contained. Alternatively, the compound can be a cleaning compound, such as melamine, a white-colored material, or a wax-containing conditioning compound, such as the gray-colored "KNR™"

made by Nitto Denko Corporation in Osaka, Japan. Melamine and KNR™ are used during cleaning and conditioning cycles, respectively. Another conditioning compound known in the industry is "M4™," which is green in color and made by Toshiba Chemical America.

Again, collection of the compound is necessary to prevent unwanted seepage and to eliminate the need to scrape compound off the mold press after each cycle. In all cases, the paper substrate 200 and cured compound 115 are discarded after use. By using a relatively cheap paper substrate rather than the relatively expensive metal-based substrates, such as a BT substrate, for collecting cured compound, substantial savings in the production of semiconductors can be achieved. In one embodiment, each paper substrate 200 has a retail cost of about $0.10 to 0.15, as compared with a cost of about $3.00 to $6.00 for a BT substrate.

Since the molding press operates at relatively high temperatures and pressures, the paper substrate 200 needs to be physically stable and nonflammable at high temperatures. In one embodiment, the paper substrate 200 is nonflammable up to temperatures of about 185 C. and pressures of about 1300 psi. In a particular embodiment, the paper substrate 200 leaves little or no marking or staining on the molding equipment at elevated temperatures and pressures.

In one embodiment, the paper substrate 200 is comprised of any type of paper base, such as cellulose, and a binder. In one embodiment, the paper substrate 200 exhibits minimal or no outgassing when its temperatures and/or pressures are elevated and surrounding temperatures and/or pressures are subsequently reduced. In a particular embodiment, the paper base is a cellulose material having a mesh structure, as is known in the art. In another embodiment, the paper substrate 200 also comprises a suitable coating that helps to hold the paper base together. The coating can be any suitable material such as a plasticizer, resin or any suitable type of plastic material that is in a liquid state prior to application on the paper base. The liquid coating can have any suitable specific gravity and pH, such as about one (1) and 6.5–7.5, respectively. In another embodiment, a chemically stable binder is also added to the coating to minimize or prevent "outgassing" of the coating.

The binder used in the paper base or coating can be a polymer dispersion and can include compounds known to those skilled in the art, including, but not limited to, acetone, 2-propanol, 2-methyl-2-propanol, 3-methyl-2-butanone, chloroform, 1-butanol, pentanal, hexanal, furfural, heptanal, 2-heptenal, benzaldehyde, octanal, butyl benzene, nonanal, decanal, o-hydroxybiphenyl, 2,2,4-trimethyl-1,2-pentanediol diisobutyrate, heptadecane, butyl benzene, acetic acid, propanoic acid, 1,2-propanediol, 1-(2-butoxyethoxy) ethanol, pentadecane, hexadecane, 3-(1,3-butadienyl)-2,4,4-trimethyl-2-cyclohexenone, heptadecane, 2,6-bis (1,1-dimethylethyl) phenol, octadecane, 1,1'-biphenyl-2-ol, nonadecane, ethyl dibenzothiophene, methyl carbazole, and so forth, including any combination of these and other chemicals commonly used in binders.

The material used for the paper substrate 200 also needs to be of a suitable density and thickness so that it fits in the molding apparatus and also adequately prevents the collected compound from seeping through. In one embodiment, more than one layer of paper substrate 200 is used, such as two, three, or four or more layers. In one embodiment, the material has a thickness between about 0.20 to 0.75 mm. In another embodiment, the material has a thickness between about 0.23 and 0.55 mm. In a particular embodiment, Springhill Cover 10-point paper from International Paper in Memphis, Tenn. is used as the material for the paper substrate 100.

Generally, once the paper substrates 200 are in place in a mold press, the mold press clamps down on them very tightly. The desired compound is then transferred to the substrate by being heated sufficiently to cause it to flow through mold cavities and into the mask openings. After a predetermined cure time, the mold press opens, the masks and substrates are removed from the mold press, and the paper substrates containing the cured compound are removed and discarded. The paper substrates 200 of the present invention can be used in a variety of mold presses, including lab-type mold presses, automolds or other molding systems used in high volume factories.

Figure 3:
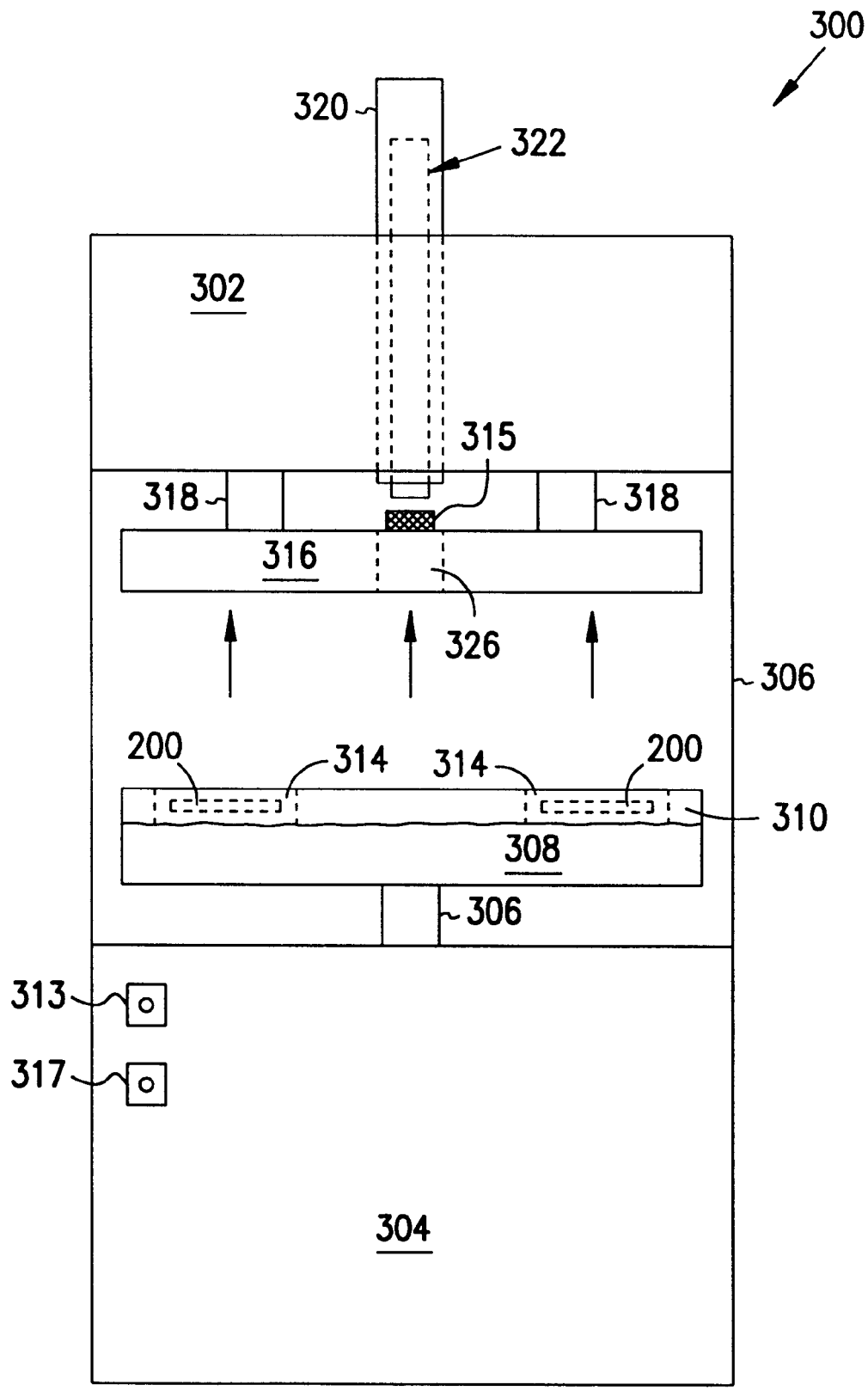
FIG. 3 is a schematic diagram of a mold press in an open position in one embodiment of the present invention.

Referring to FIG. 3, a conventional mold press 300 using a paper substrate 200 of the present invention is illustrated. The mold press 300 includes a top frame 302 and a base 304. In this embodiment, the top frame 302 and base 304 are connected with plexiglass 306 as shown. In one embodiment, the plexiglass is located on more than one side of the mold press 300. The base 304 houses a cylinder 306, bottom platen 308, frame loader 310, and first and second buttons, 313 and 317, respectively. The frame loader 310 is a device used for loading "frames" or substrates into the mold press 300. In this embodiment, the frame loader 310 is removable and is loaded with the paper substrates 200 and masks 314. The relative thicknesses of the paper substrates 200 and masks 314 are exaggerated in FIG. 3 for clarity. The top frame 302 houses a top platen 316, supports 318, and a transfer chamber 320 having a plunger 322. Preformed (partially reacted) compound 315 is placed on the top platen 316 in the area of the top platen opening 326. In one embodiment, the preformed compound 315 is not placed in the mold press 300 until it is in the closed position.

Figure 4:
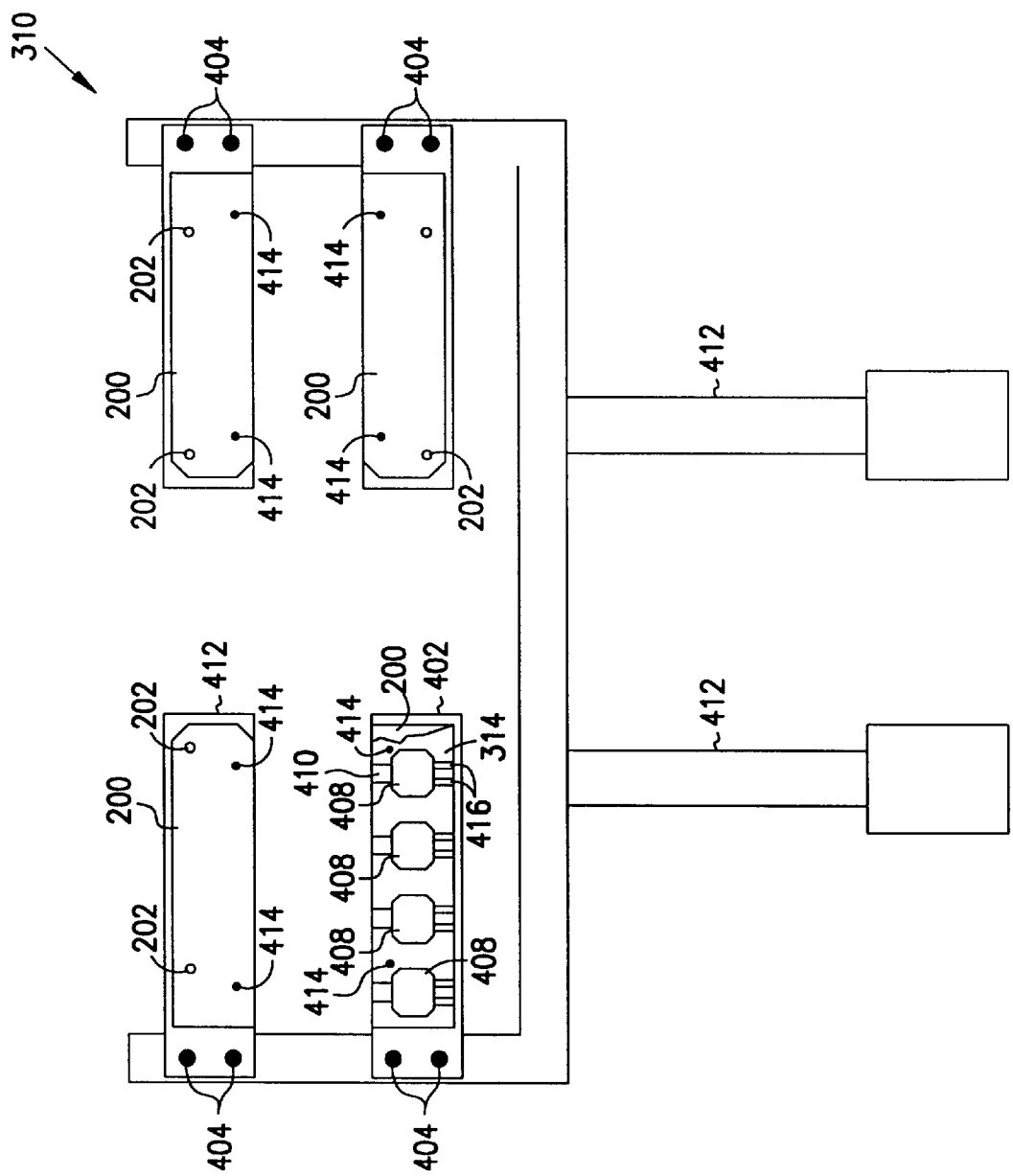
FIG. 4 is a schematic diagram of a frame loader with unused paper substrates in one embodiment of the present invention.

Prior to operating the mold press 300, the paper substrates 200 are placed on the frame loader 310 as shown in FIG. 4. Configurations of frame loaders can range from a single strip loader to loaders that handle over two dozen strips at a time. Most frame loaders are used to aid in loading substrates into the correct position in the mold press. Frame loaders also serve to prevent movement of substrates during the molding process. The accuracy of the placement of the desired compound is primarily determined by the accuracy of the frame loader position. Furthermore, substrates must be positioned or aligned properly on the frame loader itself so that the mold press can close tightly and allow compound to flow outside the established cavities of the mold. Improper substrate placement can cause downtime during production in order to clean off misdirected compound in the mold press. One advantage of the present invention is that the tight tolerance of the paper substrates 200 in the mold press 300 will help to eliminate misprocessing of the compound.

In the embodiment shown in FIG. 4, the frame loader 310 is comprised of a U-shaped main body 401, support plates 402, support plate screws 404 and handles 412. Each support plate 402 is used to support one paper substrate 202 and one mask 314. In the embodiment shown in FIG. 4, there are four support plates 402, although the invention is not so limited. In another embodiment, there are up to sixteen (16) or more support plates 402. In this embodiment, the frame loader 310 further comprises positioning pins 414 located on the support plates 402, although any suitable type of alignment means can be used. In the embodiment shown in FIG. 4, there are two positioning pins 414 on each support plate 402, although any number of positioning pins 414 can be used.

In one embodiment, the paper substrate 200 is properly positioned in the "x" and "y" directions (i.e., along its width and length) when the appropriate positioning holes 202 of the paper substrates 200 are aligned with and inserted into the positioning pins 414. In the embodiment shown in FIG. 4, the paper substrate 200 has additional positioning holes 202 that are not being used. However, the presence of an excess number of positioning holes 202 at various places on the paper substrate 200 allow any one pre-punched paper substrate 200 to be used in a variety of applications, further adding to the convenience and flexibility of the present invention.

In addition to the paper substrates 200, the mask 314 is also placed onto the support plate 402. The mask 314 can also be secured into position using any suitable type of alignment means. In this embodiment, the mask 314 is aligned in the "x" and "y" directions with the same positioning pins 414 as the paper substrate 200. In the embodiment shown in FIG. 4, only one mask 314 has been put in place, covering most of the paper substrate 200 beneath, except where there are mask openings 408. In FIG. 4, a portion of the mask 314 has been cut away to show the paper substrate 200 beneath. The mask 314 also contains a system of "gates" 410 through which the compound flows prior to entering the mask openings 408. The mask 314 can also contain vents 416 through which excess gases released from the compound can be released.

In an alternative embodiment, there are more than two positioning pins 414 to hold each substrate 200 and mask 314. In another alternative embodiment, the positioning pins 414 are located in any number of other locations on the support plate 402.

In an alternative embodiment, conventional metal substrates, such as BT substrates, are used to aid in the manufacturing of a fully usable production product. In this embodiment, the paper substrates can be utilized as shims or gaskets wherever needed to compensate for variations in tolerances between thickness of the various BT substrates. These differences are due to substrate manufacturers having slightly different tolerances for thickness. The availability of paper substrates for use in this manner can help make up for the thickness differences on production substrates that are out of tolerance.

Figure 5:
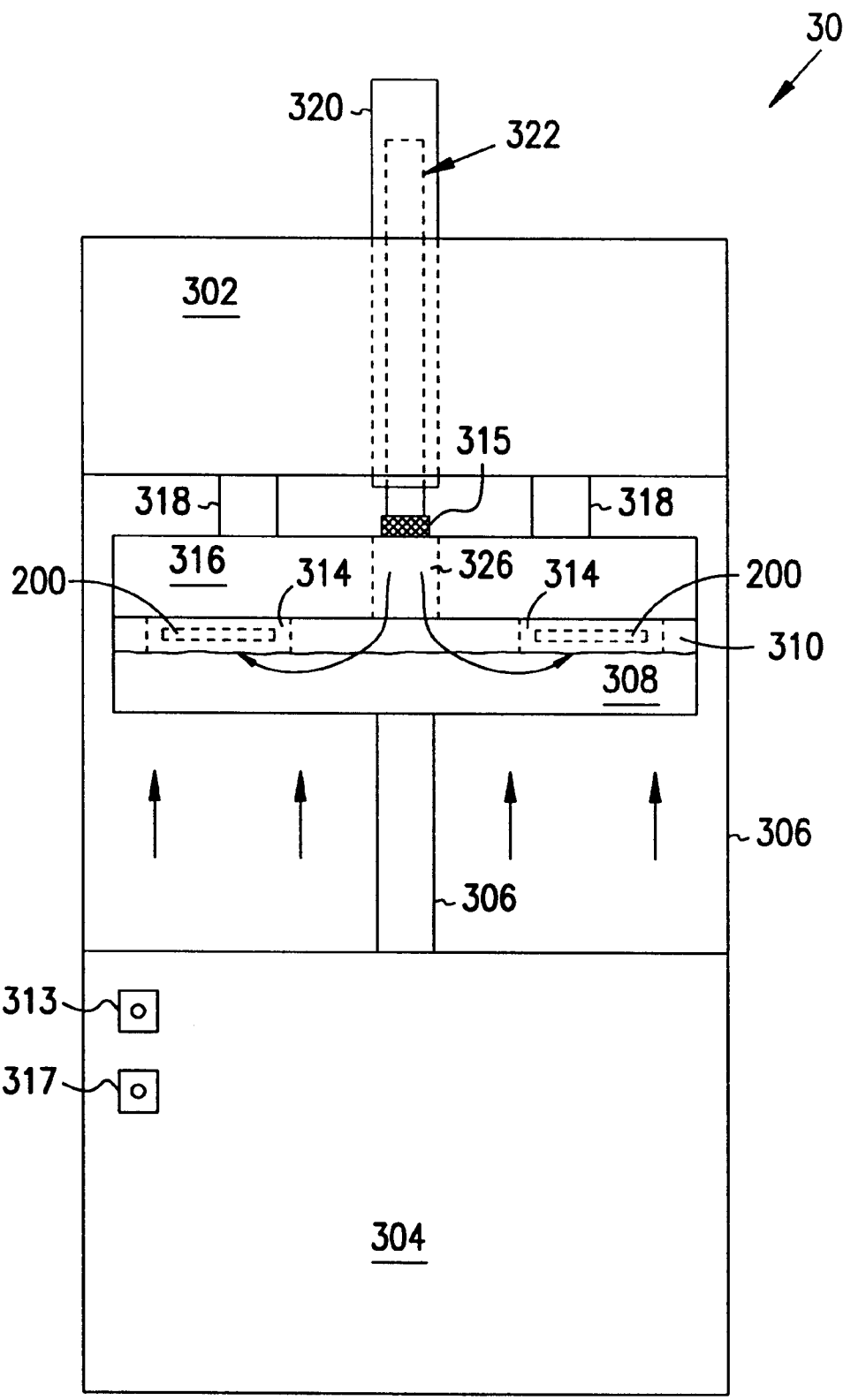
FIG. 5 is a schematic diagram of a mold press in a closed position in one embodiment of the present invention.
Figure 6:
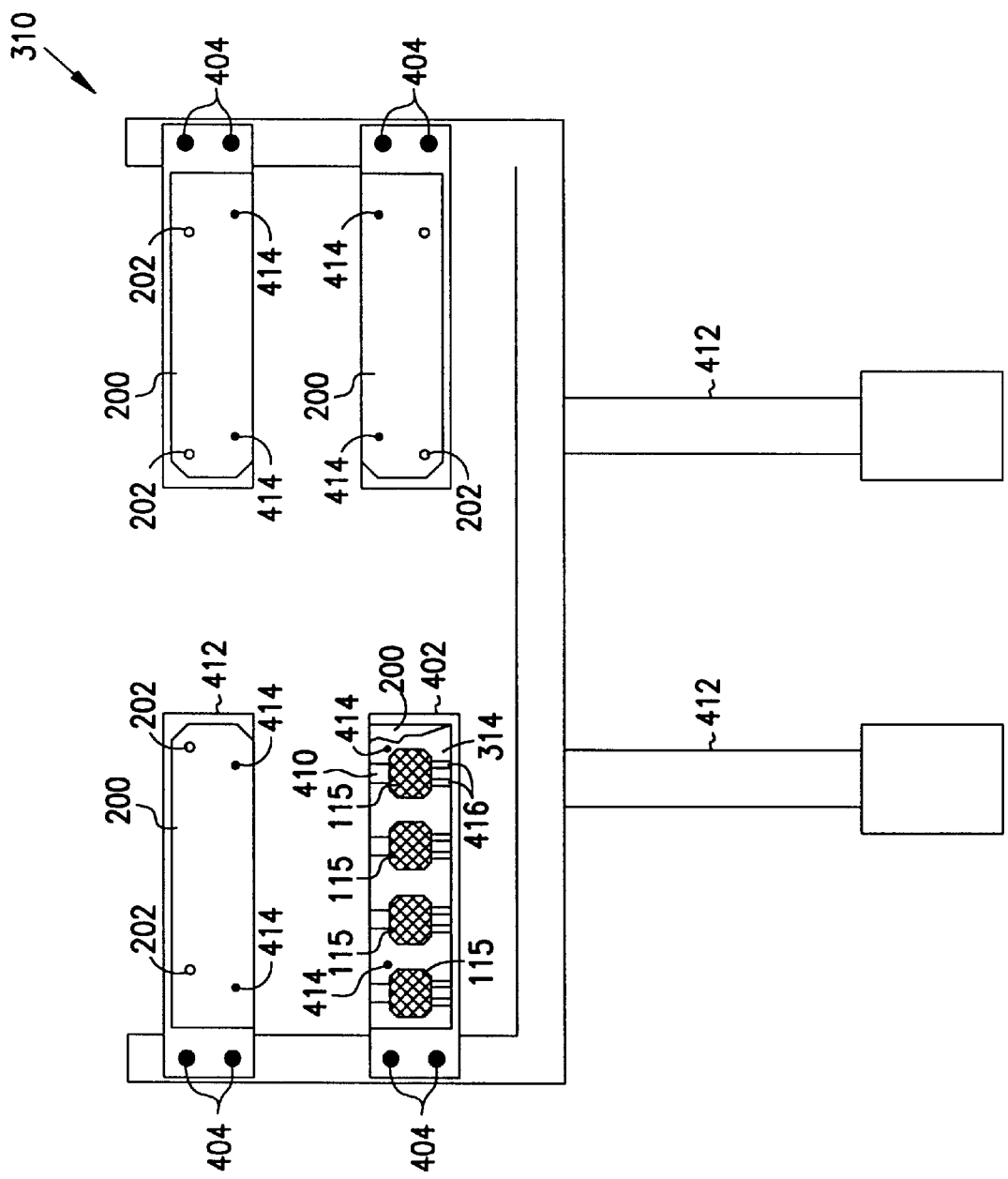
FIG. 6 is a schematic diagram of a frame loader with used paper substrates in one embodiment of the present invention.

In operation, the frame loader 310 containing the paper substrates 200 and masks 314 is placed on the bottom platen 308 as shown in FIGS. 3 and 5. The bottom platen 308 is raised until the frame loader 310 is in contact with the top platen 316. This is the closed position of the mold press 300, as shown in FIG. 5. When the mold press 300 is in this position, i.e., when the mold press 300 is considered to be "clamped down," both the mask 314 and paper substrate 200 are aligned or secured in the "z" or vertical direction. Again, the thicknesses of both the mask 314 and paper substrate 200 are exaggerated in FIG. 5 for clarity. In one embodiment, the action of moving the mold press 300 to the closed position is achieved by pressing the first button 313, which has the necessary electronics and mechanics to operate the mold press 300 in this manner. In another embodiment, a suitable controller, such as a computer, is used together with, or instead of, the buttons.

The preformed compound 315 is then placed on the top platen 316 beneath the transfer chamber 320 containing the plunger 322. In another embodiment, the preformed compound 315 is in place prior to closing the mold press 300, as shown in FIG. 3. The mold press 300 is then operated according to means known in the art. In one embodiment, the second button 317 is pressed to run the mold press 300 through one cycle of operation. Again, in an alternative embodiment, the system can include any type of controller known in the art.

During a "run," the preformed compound 315 is heated to a suitable temperature and forced through the top platen opening 326 as shown. Heating the preformed compound 315 to the appropriate temperature causes the viscosity to be reduced to the point that it the material is flowable. In one embodiment, the compound flows into runners or channels (not shown) located on the bottom platen 308, then through the gates 410 (which are essentially smaller channels), into the mask openings 408 (shown in FIG. 4) and onto the paper substrates 200 where it cools and hardens. In an alternative embodiment, the preformed compound 315 is preheated, such that it is at least slightly softened prior to being placed in the mold press 300.

In one embodiment, the preformed compound is a polymeric epoxy material (molding compound) that is heated to about 175–185 C. In another embodiment, the preformed compound is melamine (cleaning compound) and is heated to about 175–185 C. In another embodiment, the preformed compound is a wax-rich compound, such as a carnauba wax-rich compound (conditioning compound) that is heated to about 175–185 C.

The frame loader 310 is then removed from the mold press 300. The paper substrates 200 on the frame loader 310 now contain the cured compound 114 as shown in 6 (and in FIG. 2B). As discussed above in FIG. 2B, the cured compound 14 can be the actual molding compound, a cleaning compound or a conditioning compound.

In an alternative embodiment, more than one transfer chamber 320, each having a plunger 322 is used. In another alternative embodiment, a frame loader 310 is not used, and the paper substrate 200 is loaded in manually, one at a time. In yet another alternative embodiment, an automatic mold press, commonly referred to as an "automold," is used rather than a conventional press. In this embodiment, the paper substrates are contained in a magazine or cassette and no frame loader is used. Once a run starts, the "automold" automatically indexes all parts into the mold, including the paper substrates, and then ejects them when completed. Typically, there are a plurality of transfer chambers with plungers in an automold. In one embodiment there are two (2) to six (6) or more transfer chambers in one automold.

Figure 7:
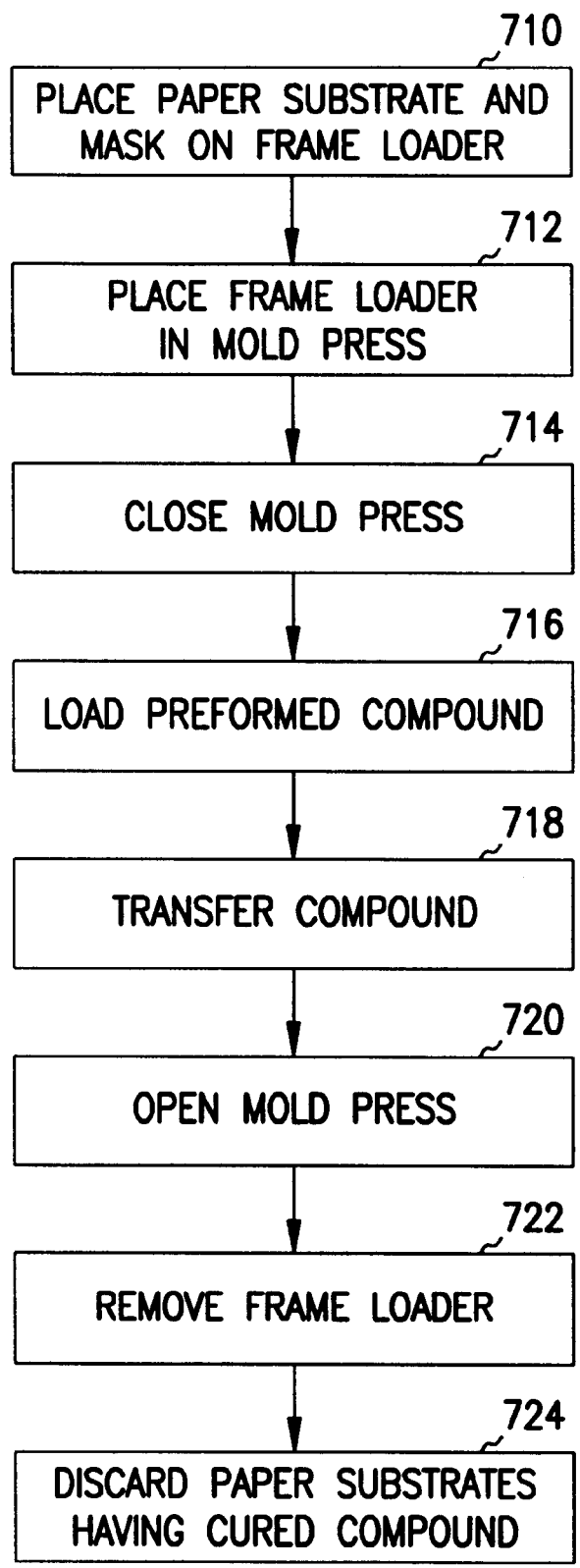
FIG. 7 is a flow diagram of a method for operating a mold press using paper substrates in one embodiment of the present invention.

FIG. 7 is a flow diagram of one method of using the paper substrates of the present invention. The process begins when paper substrates and masks are placed 710 on the frame loader. The frame loader is then placed 712 in the mold press. The mold press is closed 714 and the preformed compound is loaded 716. A cycle, which can be a set-up, cleaning or conditioning cycle, is run 718 during which the preformed compound is heated and flowed through the mold press, transferring it to the paper substrate. The cycle further includes curing or hardening the compound. The mold press is then opened 720 and the frame loader is removed 722. The paper substrates containing the cured compound are then discarded 724.

Figure 8:
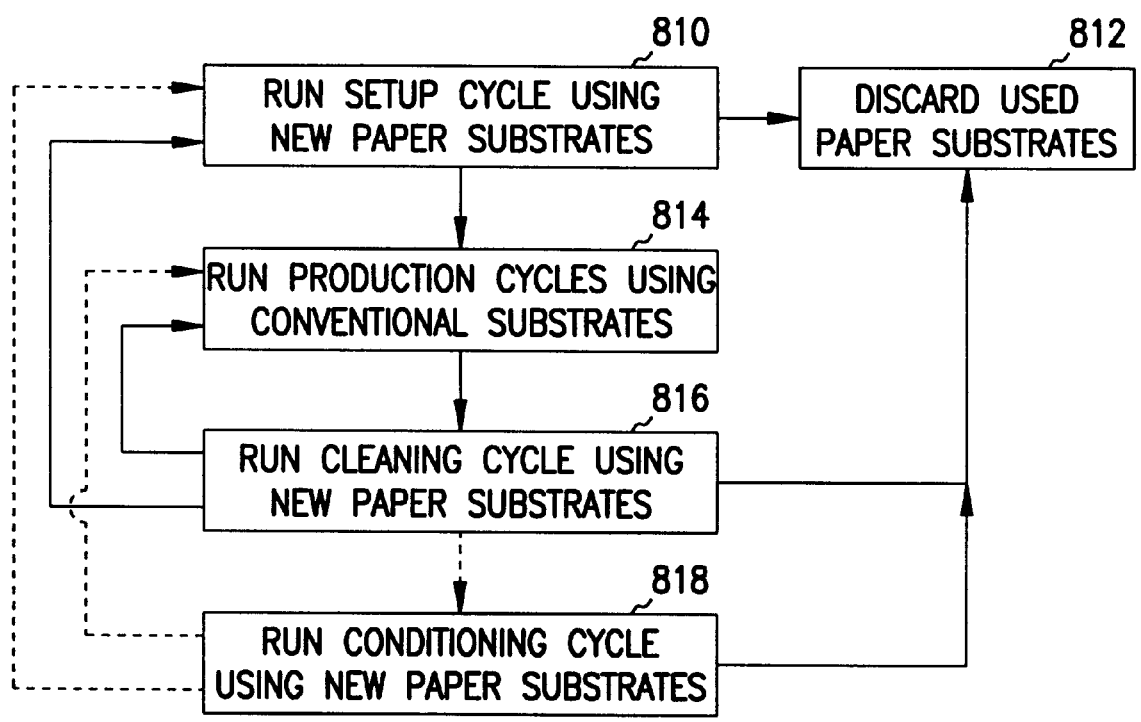
FIG. 8 is a flow diagram of a method for molding IC packages using paper substrates in one embodiment of the present invention.

FIG. 8 is a flow diagram of one method of molding IC packages comprising running 810 a set-up cycle using new paper substrates. The used paper substrates are then discarded 812. Production cycles are then run 814 using conventional substrates to encapsulate the particular product. After a number of cycles, a cleaning cycle is run 816 using new paper substrates. These used paper substrates are then discarded 812 as before. The process can continue with additional production runs 814 or start over with set-up cycles 810. In one embodiment, an additional conditioning cycle is run 818 after which the used paper substrates are discarded 812. The process can continue as before with additional production runs 814 or set-up cycles 810. In an alternative embodiment, the process includes using the paper substrates only for the cleaning and/or conditioning cycles.

The system and method of the present invention is considerably more economical and practical than currently-used methods. By using a paper-based substrate rather than a conventional metal-based substrate during set-up, cleaning and/or conditioning cycles, cost savings in excess of several million dollars per year can be achieved for a typical manufacturer.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method for operating a mold press, the mold press adapted to receive a circuit substrate having predefined dimensions comprising:

placing a paper substrate in a mold press, the paper substrate having the same predefined dimensions as the circuit substrate;

covering the paper substrate with a mask of substantially the same width and length as the paper substrate; and transferring a compound to the paper substrate.

2. The method as recited in claim 1, further comprising discarding the paper substrate after the compound has been transferred.

3. The method as recited in claim 1, wherein the mold press has a top platen and a bottom platen, the method further comprising:

pre-punching positioning holes into the paper substrate, aligning the positioning holes with positioning pins located on a frame loader prior to placing the paper substrate in the mold press, the positioning pins also used for alignment of the circuit substrate;

aligning the mask over the top of the paper substrate with the positioning pins;

placing the frame loader onto the bottom platen;

closing the mold press by raising the bottom platen until the frame loader is in contact with the top platen;

loading the preformed compound into the mold press;

opening the mold press by lowering the bottom platen, the mold press opened after the compound has been transferred to the paper substrate; and removing the frame loader containing the paper substrate, the paper substrate having areas of transferred compound.

4. The method of claim 1, wherein the mold press is an automatic mold press and the paper substrates are loaded into a magazine.

5. A method for molding an integrated circuit comprising:

running a set-up cycle using a paper substrate, wherein compound is transferred to the paper substrate, the paper substrate about the same size as a metal-based substrate.

6. The method of claim 5, wherein temperature, pressure or compound flow rate is adjusted during the set-up cycle.

7. The method of claim 5, further comprising discarding the paper substrate after the compound has been transferred.

8. A method for molding an integrated circuit comprising:

running a cleaning cycle with a paper substrate, wherein compound is transferred to the paper substrate, the paper substrate about the same size as a metal-based substrate.

9. The method as recited in claim 8, further comprising discarding the paper substrate after the compound has been transferred.

10. The method as recited in claim 8, further comprising running a conditioning cycle with a paper substrate.

11. A method for reducing integrated circuit fabrication costs comprising:

running a set-up cycle in a mold press with a paper substrate, wherein a molding compound is transferred to the paper substrate;

discarding the paper substrate;

placing a metal-based substrate in the mold press, the metal-based substrate having an integrated circuit attached; and overmolding the integrated circuit with the molding compound.

12. The method of claim 11, further comprising:

running a cleaning cycle with the paper substrate, wherein a cleaning compound is transferred to the paper substrate; and discarding the paper substrate.

13. The method of claim 12, wherein the metal-based substrate is a bismaleimide triazine substrate.

14. The method of claim 11, wherein the paper substrate has a plasticizer or resin coating.

* * * * *